United States Patent
Gu et al.

(10) Patent No.: US 10,222,904 B2
(45) Date of Patent: Mar. 5, 2019

(54) SHIFT REGISTER AND DRIVING METHOD THEREOF, GATE DRIVING CIRCUIT AND DISPLAY DEVICE

(71) Applicants: BOE TECHNOLOGY GROUP CO., LTD., Beijing (CN); HEFEI BOE OPTOELECTRONICS TECHNOLOGY CO., LTD, Hefei, Anhui (CN)

(72) Inventors: Honggang Gu, Beijing (CN); Xianjie Shao, Beijing (CN); Bo Liu, Beijing (CN); Jie Song, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 71 days.

(21) Appl. No.: 15/540,150

(22) PCT Filed: Nov. 1, 2016

(86) PCT No.: PCT/CN2016/104170
§ 371 (c)(1),
(2) Date: Jun. 27, 2017

(87) PCT Pub. No.: WO2017/121176
PCT Pub. Date: Jul. 20, 2017

(65) Prior Publication Data
US 2018/0046311 A1    Feb. 15, 2018

(30) Foreign Application Priority Data
Jan. 12, 2016    (CN) .......................... 2016 1 0017915

(51) Int. Cl.
*G09G 3/36* (2006.01)
*G11C 19/28* (2006.01)
(Continued)

(52) U.S. Cl.
CPC ............ *G06F 3/0416* (2013.01); *G06F 3/044* (2013.01); *G06F 3/0412* (2013.01);
(Continued)

(58) Field of Classification Search
CPC ...... G06F 3/0412; G06F 3/0416; G06F 3/044; G09G 3/3677; G09G 2310/0286; G09G 2300/0408; G11C 19/28
See application file for complete search history.

(56) References Cited

U.S. PATENT DOCUMENTS 9,530,370 B2 * 12/2016 Yang .................... G09G 3/3677
9,824,659 B2 * 11/2017 Gu ......................... G06F 3/0412
(Continued)

FOREIGN PATENT DOCUMENTS

CN    104021769 A    9/2014
CN    105041768 A    11/2015
(Continued)

OTHER PUBLICATIONS

International Search Report and Written Opinion dated Jan. 25, 2017; PCT/CN2016/104170.
(Continued)

*Primary Examiner* — Patrick O'Neill
(74) *Attorney, Agent, or Firm* — Ladas & Parry LLP

(57) ABSTRACT

A shift register and a driving method thereof, a gate driving circuit and a display device are provided. The shift register includes: a pre-charge module, connected to a pull-up node and configured to charge the pull-up node in a pre-charge phase; a pull-up control module, connected to the pull-up node and an output terminal and configured to pull up a
(Continued)

potential of the pull-up node in an output phase and output a driving signal through an output terminal; a denoising module, connected to the pull-up control module and the output terminal and configured to denoise the output terminal in a touch control phase; a reset module, connected to the pre-charge module, the pull-up node, the denoising module and the output terminal and configured to reset the pull-up node and the output terminal in a reset phase and denoise the pull-up node and the output terminal in a denoising phase.

18 Claims, 5 Drawing Sheets

(51) Int. Cl.
*G06F 3/041* (2006.01)
*G06F 3/044* (2006.01)

(52) U.S. Cl.
CPC ............ *G09G 3/3677* (2013.01); *G11C 19/28* (2013.01); *G09G 2300/0408* (2013.01); *G09G 2310/0286* (2013.01)

(56) References Cited

U.S. PATENT DOCUMENTS

| | | | |
|---|---|---|---|
| 2013/0027377 | A1 | 1/2013 | Yang et al. |
| 2015/0346904 | A1* | 12/2015 | Long .................... G09G 3/3677 |
| | | | 345/174 |
| 2016/0266699 | A1 | 9/2016 | Zhao et al. |
| 2017/0108989 | A1 | 4/2017 | Gu et al. |
| 2017/0199617 | A1 | 7/2017 | Gu et al. |
| 2017/0287428 | A1* | 10/2017 | Xue ...................... G09G 3/3677 |
| 2017/0364170 | A1* | 12/2017 | Gu ........................ G02F 1/1362 |

FOREIGN PATENT DOCUMENTS

| | | |
|---|---|---|
| CN | 105185343 A | 12/2015 |
| CN | 105427829 A | 3/2016 |
| CN | 105427830 A | 3/2016 |
| CN | 105679262 A | 6/2016 |

OTHER PUBLICATIONS

The First Chinese Office Action dated May 3, 2017; Appln. No. 201610017915.2.

* cited by examiner

SHIFT REGISTER AND DRIVING METHOD THEREOF, GATE DRIVING CIRCUIT AND DISPLAY DEVICE

CROSS REFERENCE

The present application claims the priority of a Chinese patent application No. 201610017915.2 filed on Jan. 12, 2016. Herein, the content disclosed by the Chinese patent application is incorporated in full by reference as a part of the present disclosure.

TECHNICAL FIELD

The present disclosure relates to a shift register and a driving method thereof, a gate driving circuit and a display device.

BACKGROUND

As a liquid crystal display device is widely applied in life, high resolution and narrow frame become a development trend of the liquid crystal display device at present. A driver of the liquid crystal display device comprises mainly a data driver and a gate driver, wherein the gate driver can make the liquid crystal display device realize high resolution and narrow frame display. The gate driving circuit can be disposed in a display panel in a packaging manner of a chip on film (COF) or a chip being attached to a glass substrate ChipOnGlass (COG), or can also be disposed in the display panel in a manner of thin film transistors (TFT) constituting an integrated circuit unit. The gate driving circuit is generally arranged that one electrode of a shift register is in end-to-end connection with one gate line, and signals are input to the gate line through the gate driving circuit, so that progressive scanning of pixels is realized. Compared with a conventional COF or COG design, the gate driver can enable the liquid crystal device to have a lower cost, and at the same time one piece of process is reduced, so that production capacity is increased.

Since a touch control display device (Touch Panel) has advantages of usability, multi-functionality of operation, gradually reducing price and stably increasing yield rate and so on, its application becomes increasingly popular. The touch control display device can be divided into an out-cell touch control display device and an in-cell touch control display device. Herein, the in-cell display device is divided into two types, i.e., an in-cell touch control display device and an on-cell touch control display device.

When the gate driver is applied to the in-cell touch control display device, a touch signal would be interfered by a driving signal output by the gate driver, so that the touch control function of the touch control display device is affected.

SUMMARY

There is provided in the present disclosure a shift register and a driving method thereof, a gate driving circuit and a display device, which are used for preventing the touch control function of the display device from being affected.

There is provided in the present disclosure a shift register, comprising:

a pre-charge module, connected to a pull-up node and configured to charge the pull-up node in a pre-charge phase;

a pull-up control module, connected to the pull-up node and configured to pull up a potential of the pull-up node in an output phase and output a driving signal through an output terminal;

a denoising module, connected to the pull-up control module and the output terminal and configured to denoise the output terminal in a touch control phase; and a reset module, connected to the pre-charge module, the pull-up node, the denoising module and the output terminal and configured to reset the pull-up node and the output terminal in a reset phase and denoise the pull-up node and the output terminal in a denoising phase, wherein the pull-up node is a connecting point between the pre-charge module, the reset module and the pull-up control module.

Optionally, the shift register further comprises: a compensation module, connected to the pull-up node and configured to charge the pull-up node in the touch control phase.

Optionally, the shift register further comprises: a pull-down control module, connected to the pull-up node, a pull-down node and the reset module and configured to pull down a potential of the pull-down node, and the pull-down node is a connecting point between the reset module and the pull-down control module.

Optionally, when forward scanning is carried out, the pre-charge module comprises a first switch transistor;

a control electrode of the first switch transistor is connected to a signal input terminal;

a first electrode of the first switch transistor is connected to a first power supply;

a second electrode of the first switch transistor is connected to the pull-up node.

Optionally, when forward scanning is carried out, the reset module comprises: a second switch transistor, a fourth switch transistor, a seventh switch transistor, an eighth switch transistor, a ninth switch transistor and a tenth switch transistor;

a control electrode of the second switch transistor is connected to a reset signal terminal, a first electrode of the second switch transistor is connected to the pull-up node, and a second electrode of the second switch transistor is connected to a second power supply;

a control electrode of the fourth switch transistor is connected to the pull-down node, a first electrode of the fourth switch transistor is connected to the pull-up control module, the output terminal and the denoising module, and a second electrode of the fourth switch transistor is connected to a third power supply and the denoising module;

a control electrode of the seventh switch transistor is connected to the pull-up node, a first electrode of the seventh switch transistor is connected to a control electrode of the eighth switch transistor and a second electrode of the ninth switch transistor, and a second electrode of the seventh switch transistor is connected to the third power supply;

the control electrode of the eighth switch transistor is connected to the second electrode of the ninth switch transistor, a first electrode of the eighth switch transistor is connected to a fourth power supply and a control electrode of the ninth switch transistor, and a second electrode of the eighth switch transistor is connected to the pull-down node;

the control electrode of the ninth switch transistor is connected to a first electrode of the ninth switch transistor and the fourth power supply; and a control electrode of the tenth switch transistor is connected to the pull-down node, a first electrode of the tenth switch transistor is connected to the pull-up node, and a second electrode of the tenth switch transistor is connected to the third power supply.

Optionally, when backward scanning is carried out, the pre-charge module comprises the second switch transistor;

the control electrode of the second switch transistor is connected to the reset signal terminal;

the first electrode of the second switch transistor is connected to the pull-up node; and the second electrode of the second switch transistor is connected to the second power supply.

Optionally, when backward scanning is carried out, the reset module comprises: a first switch transistor, the fourth switch transistor, the seventh switch transistor, the eighth switch transistor, the ninth switch transistor and the tenth switch transistor;

a control electrode of the first switch transistor is connected to the signal input terminal, a first electrode of the first switch transistor is connected to the first power supply, and a second electrode of the first switch transistor is connected to the pull-up node;

the control electrode of the fourth switch transistor is connected to the pull-down node, the first electrode of the fourth switch transistor is connected to the pull-up control module, the output terminal and the denoising module, and the second electrode of the fourth switch transistor is connected to the third power supply and the denoising module;

the control electrode of the seventh switch transistor is connected to the pull-up node, the first electrode of the seventh switch transistor is connected to the control electrode of the eighth switch transistor and the second electrode of the ninth switch transistor, and the second electrode of the seventh switch transistor is connected to the third power supply;

the control electrode of the eighth switch transistor is connected to the second electrode of the ninth switch transistor, the first electrode of the eighth switch transistor is connected to the fourth power supply and the control electrode of the ninth switch transistor, and the second electrode of the eighth switch transistor is connected to the pull-down node;

the control electrode of the ninth switch transistor is connected to the first electrode of the ninth switch transistor and the fourth power supply; and the control electrode of the tenth switch transistor is connected to the pull-down node, the first electrode of the tenth switch transistor is connected to the pull-up node, and the second electrode of the tenth switch transistor is connected to the third power supply.

Optionally, the pull-up control module comprises: a third switch transistor and a capacitor;

a control electrode of the third switch transistor is connected to the pull-up node, a first electrode of the third switch transistor is connected to a clock signal terminal, and a second electrode of the third switch transistor is connected to a second terminal of the capacitor, and the output terminal and the denoising module; and a first terminal of the capacitor is connected to the pull-up node, and the second terminal of the capacitor is connected to the output terminal, the reset module, and the denoising module.

Optionally, the denoising module comprises: a fifth switch transistor; and a control electrode of the fifth switch transistor is connected to a switch power supply, a first electrode of the fifth switch transistor is connected to the reset module, the output terminal and the pull-up control module, and a second electrode of the fifth switch transistor is connected to the reset module and the third power supply.

Optionally, the compensation module comprises: a eleventh switch transistor, a twelfth switch transistor and a thirteenth switch transistor;

a control electrode of the eleventh switch transistor is connected to a second electrode of the twelfth transistor and a control electrode of the thirteenth transistor, a first electrode of the eleventh switch transistor is connected to the switch power supply and a first electrode of the twelfth switch transistor, and a second electrode of the eleventh switch transistor is connected to a first electrode of the thirteen switch transistor;

a control electrode of the twelfth switch transistor is connected to the pull-up node, a first electrode of the twelfth switch transistor is connected to the switch power supply, and a second electrode of the twelfth switch transistor is connected to the control electrode of the thirteen switch transistor; and a second electrode of the thirteenth switch transistor is connected to the puff-up node.

Optionally, the pull-down control module comprises: a sixth switch transistor; and a control electrode of the sixth switch transistor is connected o the pull-up node, a first electrode of the sixth switch transistor is connected to the pull-down node, and a second electrode of the sixth switch transistor is connected to the third power supply.

There is provided according to another aspect of the present disclosure a gate driving circuit, comprising: a plurality of shift registers connected in cascades.

There is provided according to another aspect of the present disclosure a display device, comprising the gate driving circuit as described above.

There is provided according to another aspect of the present disclosure a driving method of a shift register, comprising:

in a pre-charge phase: the pre-charge module charges a pull-up node;

in a touch control phase: the denoising model denoises an output terminal;

in an output phase: the pull-up control module pulls up a potential of the pull-up node and outputs a driving signal through the output terminal;

in a reset phase: the reset module resets the pull-up node and the output terminal and denoises the pull-up node and the output terminal in the denoising phase.

In the technical solutions of the shift register and the driving method thereof, the gate driving circuit and the display device provided in the present disclosure, the shift register comprises the pre-charge module, the reset module, the pull-up control module and the denoising module, wherein the denoising module denoises the output terminal in the touch control phase, which avoids the driving signal output by the output terminal from interfering with the touch control signal, and thus prevents the touch control function of the display device from being affected.

DETAILED DESCRIPTION

In order to make those skilled in the art understand the technical solution of the present disclosure to the better. A shift register and a driving method thereof, a gate driving circuit and a display device provided in the present disclosure will be described below in detail by combining with figures.

Figure 1:
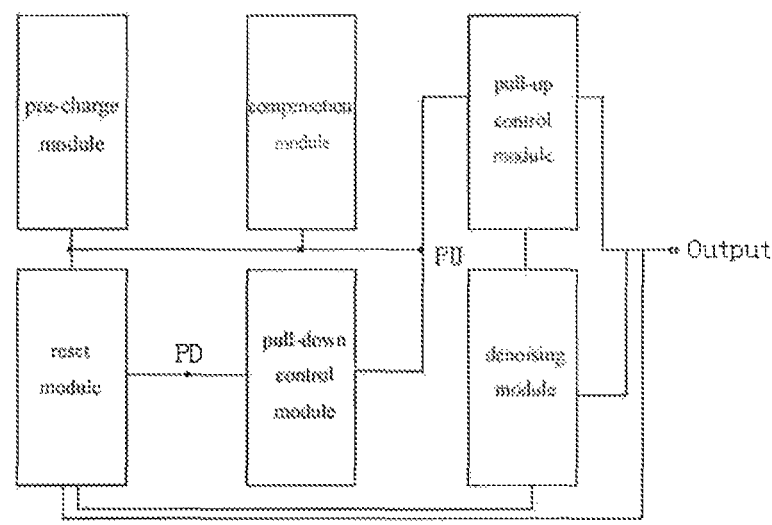
FIG. 1 is a structure schematic diagram of a shift register provided in a first embodiment of the present disclosure.

FIG. 1 is a structure schematic diagram of a shift register provided in a first embodiment of the present disclosure. As shown in FIG. 1, the shift register comprises: a pre-charge module 1, a reset module 2, a pull-up control module 3 and a denoising module 4. The pre-charge module 1 is connected to the reset module 2 and a pull-up node PU, the reset module 2 is connected to the pull-up mode PU, the denoising module 4 and an output terminal Output, the pull-up control module 3 is connected to the pull-up node PU, the denoising module 4 and the output terminal Output, and the denoising module 4 is connected to the output terminal Output. The pull-up node PU is a connecting point of the pre-precharge module 1, the reset module 2, and the pull-up control module 3.

The pre-charge module 1 is configured to charge the pull-up node PU in a pre-charge phase. The denoising module 4 is configured to denoise the output terminal in a touch control phase. The pull-up control module 3 is configured to pull up a potential of the pull-up node in an output phase, and output a driving signal through the output terminal. The reset module 2 is configured to reset the pull-up node PU and the output terminal Output in a reset phase, and denoise the pull-up node PU and the output terminal Output in a denoising phase.

Further, the shift register can further comprise: a compensation module 5 connected to the pull-up node PU. The compensation module 5 is configured to charge the pull-up node in the touch control phase.

Further, the shift register can further comprise: a pull-down control module 6 connected to the pull-up node PU and a pull-down node PD. The reset module 2 is further connected to the pull-down node PD. The pull-down control module 6 is configured to pull down a potential of the pull-down node PD.

As shown in FIG. 1, the pull-down node PD is a connecting point between the reset module 2 and the pull-down control module 6.

The shift register provided in the present embodiment comprises the pre-charge module, the reset module, the pull-up control module and the denoising module, wherein the denoising module denoises the output terminal in the touch control phase, which avoids a driving signal output by the output terminal from interfering with the touch control signal, and thus prevents the touch control function of the display device from being affected.

Figure 2:
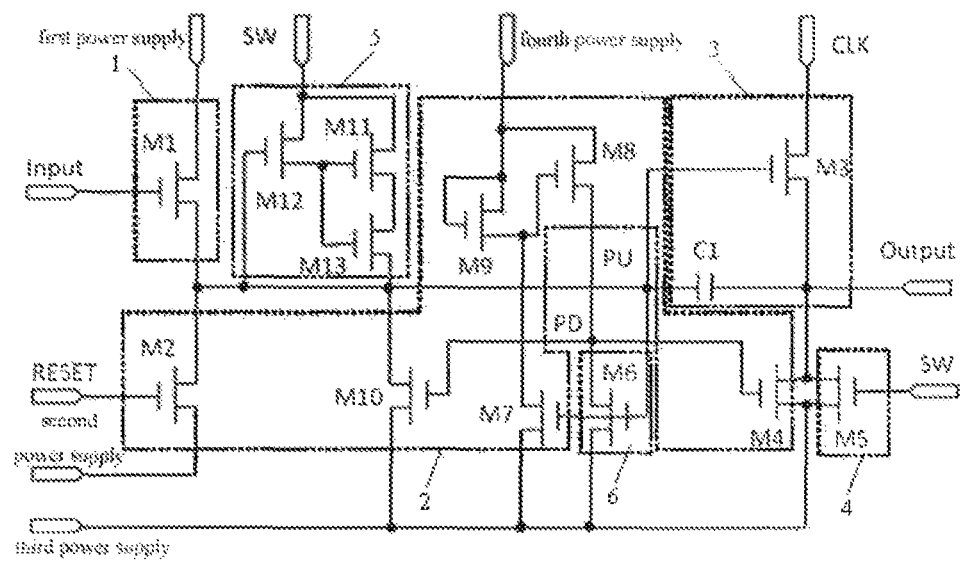
FIG. 2 is a structure schematic diagram of a shift register provided in a second embodiment of the present disclosure.

FIG. 2 is a structure schematic diagram of a shift register provided in a second embodiment of the present disclosure. As shown in FIG. 2, on the basis of the first embodiment, in the shift register, the pre-charge module 1 comprises a first switch transistor M1. A control electrode of the first switch transistor M1 is connected to a signal input terminal Input, a first electrode of the first switch transistor M1 is connected to a first power supply, and a second electrode of the first switch transistor M1 is connected to the pull-up node PU.

As shown in FIG. 2, in the embodiment, the reset module 2 comprises: a second switch transistor M2, a fourth switch transistor M4, a seventh switch transistor M7, an eighth switch transistor M8, a ninth switch transistor M9 and a tenth switch transistor M10. A control electrode of the second switch transistor M2 is connected to a reset signal terminal RESET, a first electrode of the second switch transistor M2 is connected o the pull-up node PU, and a second electrode of the second switch transistor M2 is connected to a second power supply. A control electrode of the fourth switch transistor M4 is connected to the pull-down PD, a first electrode of the fourth switch transistor M4 is connected to the pull-up control module 3, the output terminal Output and the denoising module 4, and a second electrode of the fourth switch transistor M4 is connected to the third power supply and the denoising module 4. A control electrode of the seventh switch transistor M7 is connected to the pull-up node PU, a first electrode of the seventh switch transistor M7 is connected to a control electrode of the eighth switch transistor M8 and a second electrode of the ninth switch transistor M9, and a second electrode of the seventh switch transistor M7 is connected to the third power supply. The control electrode of the eighth switch transistor M8 is connected to the second electrode of the ninth switch transistor M9, a first electrode of the eighth switch transistor M8 is connected to a fourth power supply and a control electrode of the ninth transistor M9, and a second electrode of the eighth switch transistor M8 is connected to the pull-down node PD. A control electrode of the ninth switch transistor M9 is connected to a first electrode of the ninth switch transistor M9 and the fourth power supply. A control electrode of the tenth switch transistor M10 is connected to the pull-down node PD, a first electrode of the tenth switch transistor M10 is connected to the pull-up node PU, and a second electrode of the tenth switch transistor M10 is connected to the third power supply.

As shown in FIG. 2, in the present embodiment, the pull-up control module 3 comprises: a third switch transistor M3 and a capacitor C1. A control electrode of the third switch transistor M3 is connected to the pull-up node PU, a first electrode of the third switch transistor M3 is connected to a clock signal terminal and a second electrode of the third switch transistor M3 is connected to a second terminal of the capacitor C1, the output terminal Output and the denoising module 5. A first terminal of the capacitor C1 is connected to the pull-up node PU, and the second terminal thereof is connected to the output terminal Output, and the reset module 2 and the denoising module 5.

As shown in FIG. 2, in the present embodiment, the denoising module 4 comprises: a fifth switch transistor M5. A control electrode of the fifth switch transistor M5 is connected to a switch power supply SW, a first electrode of the fifth switch transistor 5 is connected to the reset module 2, the output terminal Output and the pull-up control module 3, and a second electrode of the fifth switch transistor M5 is connected to the reset module 2 and the third power supply.

Further, as shown in FIG. 2, in the present embodiment, the compensation module 5 comprises: an eleventh switch transistor M11, a twelfth switch transistor M12 and a thirteenth switch transistor M13. A control electrode of the eleventh switch transistor M11 is connected to a second electrode of the twelfth switch transistor M12 and a control electrode of the thirteenth switch transistor M13, a first electrode of the eleventh switch transistor M11 is connected to a switch power supply SW and a first electrode of the twelfth switch transistor M12, and a second electrode of the eleventh switch transistor M11 is connected to a first electrode of the thirteenth switch transistor M13. The control electrode of the twelfth switch transistor M12 is connected to the pull-up node, the first electrode of the twelfth switch transistor M12 is connected to the switch power supply SW, and a second electrode of the twelfth switch transistor M12 is connected to the control electrode of the thirteen switch transistor M13. A second electrode of the thirteenth switch transistor M13 is connected to the pull-up node PU.

Further, as shown in FIG. 2, in the present embodiment, the pull-down control module 6 comprises: a sixth switch transistor M6, A control electrode of the sixth switch transistor M6 is connected to the pull-up node PU, a first electrode of the sixth switch transistor M6 is connected to the pull-down node PD, and a second electrode of the sixth switch transistor M6 is connected to the third power supply.

In particular, the first electrode of the fourth switch transistor M4 is connected to the first electrode of the fifth switch transistor M5 and the second electrode of the third switch transistor M3, the second terminal of the capacitor C1 and the output terminal Output, and the second electrode of the fourth switch transistor M4 is connected to the second electrode of the fifth switch transistor M5 and the third power supply. The control electrode of the tenth switch transistor M10 is connected to the pull-down node PD. The second electrode of the third switch transistor M3 is connected to the first electrode of the fourth switch transistor M4, the first electrode of the fifth switch transistor M5, the second terminal of the capacitor C1 and the output terminal Output. The second terminal of the capacitor C1 is connected to the first electrode of the fourth switch transistor M4, the first electrode of the fifth switch transistor M5 and the output terminal Output.

Operation process of the shift register provided in the present embodiment will be described below in detail by referring to timing diagrams of FIGS. 3 to 5.

The shift registers in the embodiment can form a gate driving circuit in a manner of being connected in cascades. The shift register in the embodiment can realize gate driving processes in two modes.

Figure 3:
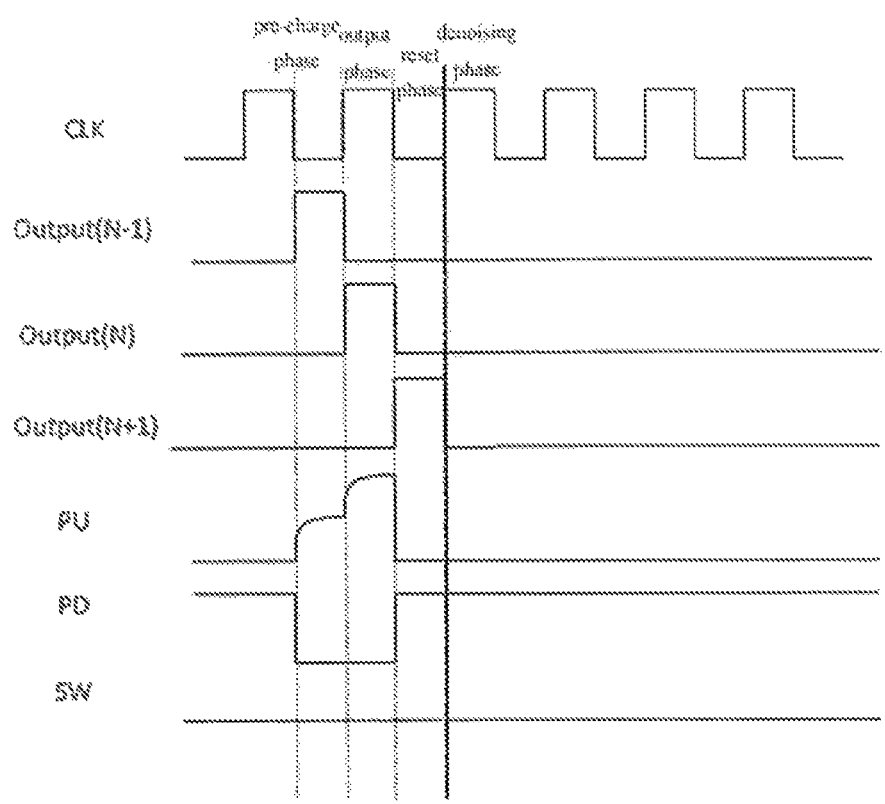
FIG. 3 is a timing diagram when the shift register in FIG. 2 carries out forward scanning in a first mode.

FIG. 3 is a timing diagram when the shift register in FIG. 2 carries out forward scanning in a first mode. In combination with FIGS. 2 and 3, the first mode is a compatibility mode. This mode is divided into a pre-charge phase, an output phase, a reset phase and a denoising phase.

In the pie-charge phase, the first switch transistor M1 is turned on under the control of an input signal input by a signal input terminal Input (N), wherein the input signal input by the signal input terminal Input(N) is an output signal output by an output terminal Output(n−1) of a previous stage of shift register, and an output signal output by an output terminal Output(N−1) of a previous stage of shift register is a high level signal. A clock signal CLK input by the clock signal terminal CLK is a low level signal. Since the first switch transistor M1 is turned on, the first power supply charges the capacitor C1 through the first switch transistor M1, such that the voltage of the pull-up node NJ is pulled up. At this time, the voltage output by the first power supply is a voltage VDD, and the voltage VDD output by the first power supply is at a high level. The third switch transistor M3, the sixth switch transistor M6 and the seventh switch transistor M7 are turned on under the control of the voltage of PU. At this time, the voltage at the node R1 is at the high level. The seventh switch transistor M7 is turned on, such that the voltage of the gate of the eighth switch transistor M8 is a voltage VGL output by the third power supply, and the eighth switch transistor M8 is turned off under the control of the voltage VGL output, by the third power supply. At this time, the voltage VGL output by the third power supply is at the low level. The sixth switch transistor M6 is turned on, such that the voltage of the pull-own node PD is the voltage output by the third power supply. Since the voltage VGL, output by the third power supply is at the low level, the voltage of the pull-down node PD is at the low level. The fourth switch transistor M4 and the tenth switch transistor M10 are turned off under the control of the voltage of the pull-down node PD. The fifth switch transistor M5 is turned off under the control of the voltage output by the switch power supply SW, and at this time the voltage output by the switch power supply SW is at the low level. The fourth switch transistor M4, the fifth switch transistor M5 and the tenth switch transistor M10 are turned off, so that it is ensured that the signal of the output terminal Output is output stably.

In the output phase, the fifth switch transistor M5 is turned off under the control of the voltage output by the switch power supply SW, and at this time the voltage output by the switch power supply SW is at the low level. The twelfth switch transistor M12 is turned off under control the voltage of the pull-up node PU, and the eleventh switch transistor M11 and the thirteenth switch transistor M13 are turned off under the control of the voltage output by the switch power supply SW. At this time, the first switch transistor M1 is turned off under the control of the input signal input by the signal input terminal Input(N), wherein the input signal input by the signal input terminal Input(N) is an output signal output by an output terminal Output(N−1) of a previous stage of shift register, and the output signal output by the output terminal Output(N−1) of the previous stage of shift register is a low level signal. The voltage of the pull-up node PU is maintained at the high level, so that the third switch transistor M3 maintains turned on under the control of the voltage of the pull-up node PU. At this time, since the clock signal input by the clock signal input terminal CLK is at the high level, the voltage of the pull-up node PU is enlarged under the effect of bootstrapping, and finally the driving signal is transmitted to the output terminal Output, so that the output terminal Output outputs the driving signal. At this time, the sixth switch transistor M6 and the seventh switch transistor M7 are still in a turn-on state under the control of the voltage of the node PU, so that the fourth switch transistor M4 and the tenth switch transistor M10 are still in the turn-off state, while the fifth switch transistor M5 is still in the turn-off state under the control of the voltage output by the switch power supply SW, so as to ensure that the signal of the output terminal Output is output stably.

In the reset phase, the second switch transistor M2 is turned on under control the reset signal input by the reset signal terminal RESET, wherein the reset signal input by the reset signal terminal RESET is an output signal output by an output terminal Output(N+1) of a next stage of shift register, and the output signal output by the output terminal Out(N+1) of the next stage of shift register is the high level signal. After the second switch transistor M2 is turned on, the voltage of the pull-up node PU is pulled down to the voltage output by the second power supply under the influence of the voltage VSS output by the second power supply. At this time, since the voltage VSS output by the second power supply is at the low level, the voltage of the pull-up node PU is at the low level, so that the third switch transistor M3, the sixth switch transistor M6 and the seventh switch transistor M7 are turned off. The ninth switch transistor M9 and the eighth switch transistor M8 are turned on under the control the voltage VGH output by the fourth power supply, the voltage VGH output by the fourth power supply is at the high level, so that the voltage of the pull-down node PD is pulled up, and the voltage of the pull-down node PD is at the high level. The fourth switch transistor M4 and the tenth switch transistor M10 are turned on under the control of the pull-down node PD, so that the voltage of the pull-up node PU is pulled down to the voltage VGL output by the third power supply through the tenth switch transistor M10, and the voltage of the output terminal Output is pulled down to the voltage VGL output by the third power supply through the fourth switch transistor M4, and the voltage VCR, output by the third power supply is at the low level.

In the denoising phase, no signal is output by the output terminal Output, and the first switch transistor M1 maintains in the turn-off state. The eighth switch transistor M8 and the ninth switch transistor M9 maintains in the turn-on state, such that the voltage of the pull-down node PD maintains at the high level when no signal is output by the output terminal Output, the fourth switch transistor M4 and the tenth switch transistor M10 are turned on, the tenth switch transistor M10 denoises the pull-up node PU constantly, and the fourth switch transistor M4 denoises the output terminal Output constantly. The aforesaid denoising process can make the coupling nose produced by the clock signal terminal eliminated, so as to guarantee stability of signal output.

Before display of a next frame picture comes, the gate shift register repeats the denoising phase to carry out denoising process constantly. During the period that the display of a current frame picture ends up and before the display of the next frame picture comes, that is, in a V-Blank phase, the fifth switch transistor M5 is turned on under the control of the voltage output by the switch power supply SW to denoise the output terminal Output. At this time, the voltage output by the switch power supply SW is at the high level. However, since the voltage of the pull-up node PU is at the low level, the twelfth switch transistor M12 is turned off under the control of the voltage of the pull-up node PU, so that the eleventh switch transistor M11 and the thirteen switch transistor M13 are also turned off. Herein, when it needs to carry out the touch control function, the touch control process can be realized in the V-Blank phase. Since in the V-Blank phase the output terminal Output is denoised constantly, the driving signal output by the output terminal can be prevented from interfering with the touch control signal. It can be known from the above content that the compatibility mode can be used for the V-Blank mode in which the touch control process is carried out in the V-Blank phase. In addition, when the display device does not carry out the touch control phase, the compatibility mode can further be used for the display mode in which no touch control process is carried out. To sum up, the compatibility mode can be compatible with the display mode and the V-Blank mode. Therefore, the compatibility mode can be compatible with a conventional gate driving mode and the V-Bank gate driving mode of the in-cell touch control. This phase is not shown particularly in the figure.

Figure 4:
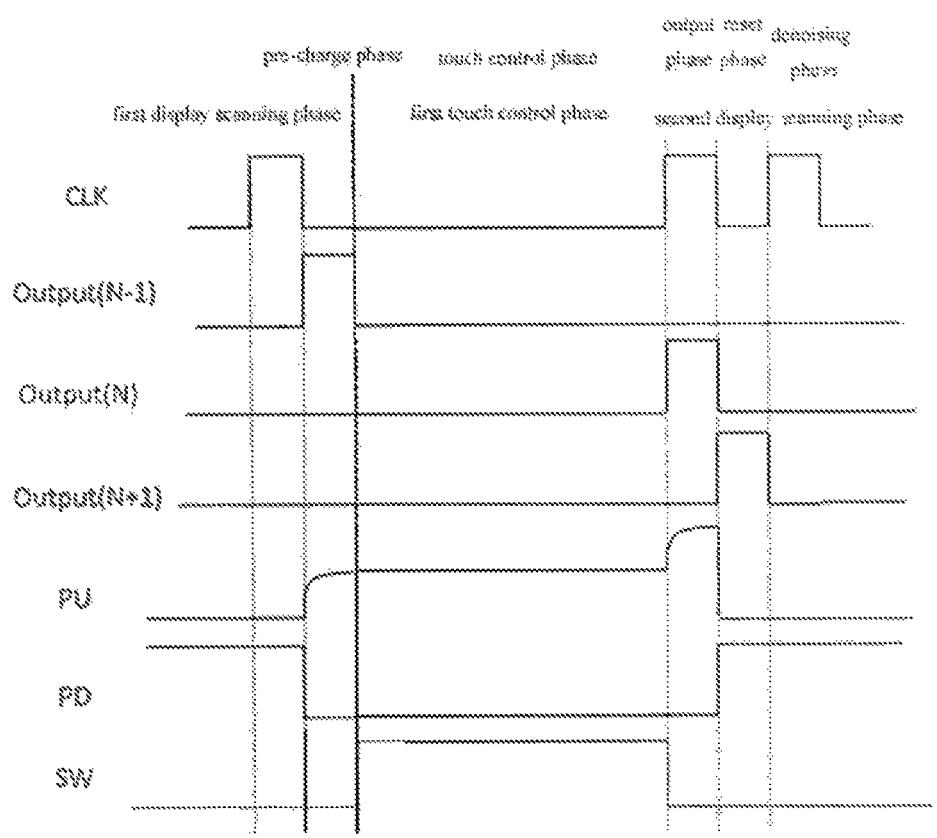
FIG. 4 is a timing diagram when the shift register in FIG. 2 carries out forward scanning in a second mode.

FIG. 4 is a timing diagram when the shift register in FIG. 2 carries out the forward scanning in the second mode. In combination with FIGS. 2 and 4, the second mode is an H-Blank mode. This mode comprises a pre-charge phase, a touch control phase, an output phase, a reset phase and a denoising phase.

In the pre-charge phase, the first switch transistor M1 is turned on under the control of the input signal input by the signal input terminal Input(N), wherein the input signal input by the signal input terminal Input(N) is the output signal output by the output terminal Output(N−1) of the previous stage of shift register, and the output signal output by the output terminal Output(N−1) of the previous stage of shift register is the high level signal. The clock signal CLK input by the clock signal terminal is the low level signal. Since the first switch transistor M1 is turned on, the first power supply charges the capacitor C1 through the first switch transistor M1, such that the voltage of the pull-up node PU is pulled up. At this time, the voltage output by the first power supply is the voltage VDD, and the voltage VDD is at the high level. The third switch transistor M3, the sixth switch transistor M6 and the seventh switch transistor M7 are turned on under the control of the voltage of the pull-up node PU. At this time, the voltage of the pull-up node PU is at the high level. The seventh switch transistor M7 is turned on, such that the voltage of the gate of the eighth switch transistor M8 is the voltage VGL output by the third power supply, and the eighth switch transistor M8 is turned off under the control of the voltage VGL output by the third power supply. At this time, the voltage VGL output by the third power supply is at the low level. The sixth switch transistor M6 is turned on, such that the voltage of the pull-down node PD is the voltage VGL output by the third power supply. Since the voltage VGL output by the third power supply is at the low level, the voltage of the pull-down node PD is at the low level, and the fourth switch transistor M4 and the tenth switch transistor M10 are turned off under the control of the voltage of the pull-down node PD. The fifth switch transistor M5 is turned off under the control of the voltage output by the switch power supply SW, and at this time the voltage output by the switch power supply SW is at the low level. The fourth switch transistor M4, the fifth switch transistor M5 and the tenth switch transistor M10 are turned off, so as to ensure that the signal of the output terminal Output is output stably.

In the touch control phase (i.e., H-Blank phase), the voltage of the pull-up node PU continues to maintain the high voltage, and the twelfth switch transistor M12 is turned on under the control of the voltage of the pull-up node PU. At this time, the voltage output by the switch power supply SW is at the high level, and the eleventh switch transistor M11 and the thirteen switch transistor M13 are turned on under the control of the voltage output by the switch power supply SW. Since the voltage output by the switch power supply SW is at the high level, the fifth switch transistor M5 is turned on under the control of the voltage output by the switch power supply SW to denoise the output terminal Output(N), such that no driving signal is output by the output terminal Output, which prevents the diving signal from interfering with the touch control signal, thereby ensuring that no influence is made on the touch control function. Since the eleventh switch transistor M11 and the thirteenth switch transistor M13 are turned on, the switch power supply SW can carry out supplementary charge on the pull-up node PU, such that the voltage of the pull-up node PU is at the high level and would not be reduced. Since three switch transistors, i.e., the eleventh switch transistor M11, the twelfth switch transistor M12 and the thirteenth switch transistor M13, are disposed in the compensation module, and the switch power supply SW needs to charge the pull-up node PU through two transistors, i.e., the eleventh switch transistor M11 and the thirteenth switch transistor M13, so that coupling capacitance between the switch power supply SW and the pull-up node PU is reduced effectively, which avoids the problem of influencing the display of other rows due to pulling up of the voltage of the pull-up node of other rows, so that the display quality is improved.

Figure 5:
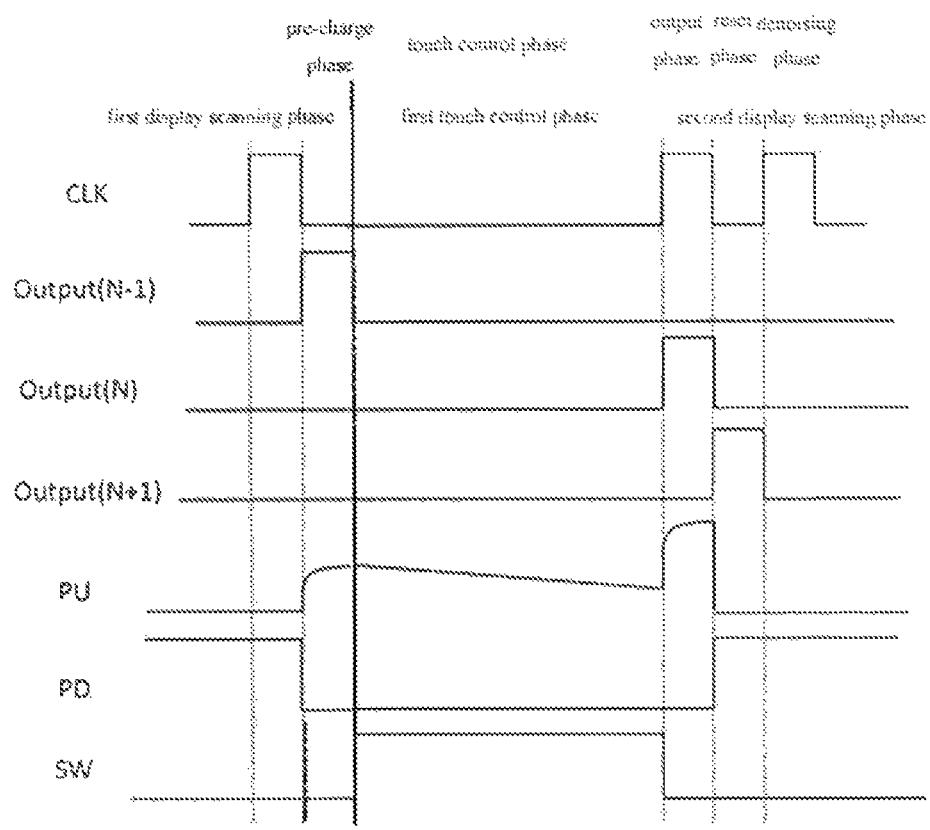
FIG. 5 is a timing diagram without compensating for a pull-up node.

FIG. 5 is a timing diagram without compensating for the pull-up node. As shown in FIG. 5 and referring to FIG. 2, since the second switch transistor M2 and the tenth switch transistor M10 have the phenomenon of leakage, the voltage of the pull-up node PU would be pulled down if a supplementary charge of the pull-up node PU is not performed, thereby causing the voltage of the pull-up node PU reduced. In this way, after the touch control is ended up, the problem that no driving signal is output or the output voltage of the driving signal is too low would occur. By comparing FIGS. 4 and 5, it can be seen that after the supplementary charge of the pull-up node PU is carried out in FIG. 4, the voltage of the pull-up node PU is at the high level and would not be reduced. At the same time, since the voltages of the pull-up node PU in the shift register corresponding to other rows are all at the low level, subsequent operation of the shift register corresponding to other rows would not be influenced.

In the output phase, at this time, the voltage output by the switch power supply SW is at the low level, and the fifth switch transistor M5 is turned off under the control of the voltage output by the switch power supply SW. The twelfth switch transistor M12 is turned on under the control of the voltage of the pull-up node PU, and then the eleventh switch transistor M11 and the thirteenth switch transistor M13 are turned off under the control of the voltage output by the switch power supply SW. At this time, the first switch transistor M1 is turned off under the control of the input signal input by the signal input terminal Input(N), wherein the input signal input by the signal input terminal Input(N) is an output signal output by the output terminal Output(N−1) of a previous stage of shift register, and the output signal output by the output terminal Output(N−1) of the previous stage of shift register is a low level signal. The voltage of the pull-up node PU maintains at the high level, and thereby the third switch transistor M3 maintains turned on under the control of the voltage of the pull-up node PU. At this time, since the clock signal CLK output by the clock signal output terminal is at the high level, the voltage of the pull-up node PU is enlarged under the effect of bootstrapping, and finally the driving signal is transmitted to the output terminal Output, so that the output terminal Output outputs the driving signal. At this time, the sixth switch transistor M6 and the seventh switch transistor M7 are still in the turn-on state under the control of the voltage of the pull-up node PU, such that the fourth switch transistor M4 and the tenth switch transistor M10 are still in the turn-off state while the fifth switch transistor M5 is still in the turn-off state under the control of the voltage output by the switch power supply SW, so as to ensure that the signal of the output terminal Output is output stably.

In the reset phase, the second switch transistor M2 is turned on under the control of the reset signal input by the reset signal terminal RESET, wherein the reset signal input by the reset signal terminal RESET is an output signal output by an output terminal Output(N+1) of a next stage of shift register, and the output signal output by the output terminal Output(N+1) of the next stage of shift register is the high level signal. After the second switch transistor M2 is turned on, the voltage of the pull-up node PU is pulled down to the voltage VSS output by the second power supply under the influence of the voltage output by the second power supply. At this time, since the voltage VSS output by the second power supply is at the low level, the voltage of the pull-up node PU is at the low level, so that the third switch transistor M3, the sixth switch transistor M6 and the seventh switch transistor M7 are turned off. The ninth switch transistor M9 and the eighth switch transistor M8 are turned on under the control of the voltage VGH output by the fourth power supply, and the voltage VGH output by the fourth power supply is at the high level, so that the voltage of the pull-down node PD is pulled up, and the voltage of the pull-down node PD is at the high level. The fourth switch transistor M4 and the tenth switch transistor M10 are turned on under the control of the pull-down node PD, so as to pull down the voltage of the pull-up node PU to the voltage output by the third power supply through the tenth switch transistor M10 and pull down the voltage of the output terminal Output to the voltage output by the third power supply through the fourth switch transistor M4, and the voltage output by the third power supply is at the low level.

In the denoising phase, no signal is output by the output terminal Output, and the first switch transistor M1 maintains in the turn-off state. The eighth switch transistor M8 and the ninth switch transistor M9 maintain in the turn-on state, such that the voltage of the pull-down node PD maintains at the high level when no signal is output by the output terminal Output. The fourth switch transistor M4 and the tenth switch transistor M10 are turned on. The tenth switch transistor M10 denoises the pull-up node PU constantly, and the fourth switch transistor M10 denoises the output terminal Output constantly. The above denoising process can make the coupling noise produced by the clock signal terminal eliminated, thereby ensuring the stability of the signal output.

Before the display of the next frame picture comes, the gate shift register repeats the denoising phase and constantly carries out the denoising process. During the period that the display of the current frame picture is ended up and before the display of the next frame picture comes, that is, in the V-Blank phase, the fifth switch transistor M5 is turned on under the control of the voltage output by the switch power supply SW to denoise the output terminal Output, and at this time, the voltage output by the switch power supply SW is at the high level. However, since the voltage of the pull-up node PU is at the low level, the twelfth switch transistor M12 is turned off under the control of the voltage of the pull-up node PU, so that the eleventh switch transistor M11 and the thirteenth switch transistor M13 are also turned off. Therefore, the V-Blank can be applied to the V-Blank gate driving mode of the in-cell touch control. This phase is not particularly shown in the figures.

It needs to note that as shown in FIGS. 4 and 5, the touch control function is realized in a certain V-Blank phase in the process of displaying. After that, the process of displaying is carries out continuously. Description is given below by taking a first touch control phase being arranged between a first display scanning phase and a second display scanning phase in FIG. 4 as an example, the above pre-charge phase is carried out in the first display scanning phase, and then it enters into the V-Blank phase subsequent to the first display scanning phase, the first touch control phase is carried out in the V-Blank phase, the second display scanning phase is carried out continuously after the touch control phase ends up, and the output phase, the reset phase and the denoising phase are carried out in the second display scanning phase.

In the shift register provided in the present embodiments, the denoising module denoises the output terminal in the touch control phase, which prevents the driving signal output by the output terminal from interfering with the touch control signal, so as to avoid the touch control function of the display device from being affected; the compensation module charges the pull-up node in the touch control phase, which ensures that the voltage of the pull-up node would not be reduced, so that the problem of no driving signal is output or the voltage output by the driving signal is too low is avoided from occurring after the touch control ends up. In the present embodiment, three switch transistors, i.e., the eleventh switch transistor, the twelfth switch transistor and the thirteenth switch transistor, are disposed in the compensation module, and the switch power supply needs to charge the pull-up node through two switch transistors, i.e., the eleventh switch transistor and the thirteenth switch transistor, so that the coupling capacitance between the switch power supply and the pull-up node is reduced effectively, and the problem of influencing the display of other rows due to the pulling up of the voltage of the pull-up node of other rows, so that the display quality is raised.

There is provided in a third embodiment of the present disclosure a shift register, and the shift register in the present embodiment can carry out backward scanning. When forward scanning and backward scanning are carried out, the structure of the shift register unit does not change, just the functions of the signal input terminal and the reset signal terminal change, so that functions of the first switch transistor in the pre-charge module and the second switch transistor in the reset module exchange. In particular, when forward scanning is carried out, the voltage VDD output by the first power supply is at the high level, and the voltage VSS output by the second power supply is at the low level; when backward scanning is carried out, the voltage VSS output by the first power supply is at the low level, and the voltage VDD output by the second power supply is at the high level. The signal input terminal input when forward scanning is carried out is used as the reset signal terminal RESET when backward scanning is carried out, while the reset signal terminal RESET when forward scanning is carried out is used as the signal input terminal Input when backward scanning is carried out.

Figure 6:
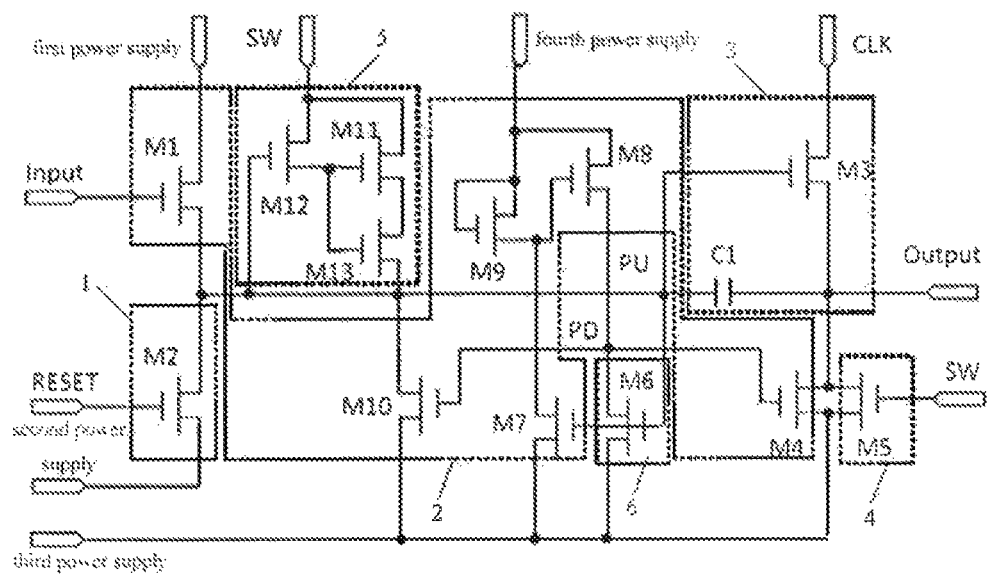
FIG. 6 is a structure schematic diagram of a shift register provided in a third embodiment of the present disclosure.

FIG. 6 is a structure schematic diagram of a shift register provided in the third embodiment of the present disclosure. As shown in FIG. 6, on the basis of the first embodiment, the pre-charge module 1 in the shift register comprises a second switch transistor M2. A control electrode of the second switch transistor M2 is connected to the reset signal terminal RESET, a first electrode of the second switch transistor M2 is connected to the pull-up node PU, and a second electrode of the second switch transistor M2 is connected to the second power supply.

In the present embodiment, the reset module 2 comprises: the first switch transistor M1, the fourth switch transistor M4, the seventh switch transistor M7, the eighth switch transistor M8, the ninth switch transistor M9 and the tenth switch transistor M10. The control electrode of the first switch transistor M1 is connected to the signal input terminal Input, the first electrode of the first switch transistor M1 is connected to the first power supply, and the second electrode of the first switch transistor M1 is connected to the pull-up node PU.

Connecting relationship of other structures in the present embodiment is the same as that in the first embodiment, and thus no further description is given herein.

The shift register in the embodiment can form a gate driving circuit by a mode of cascade connection. The shift register in the present embodiment can realize gate driving processes in two modes. The first mode is the compatibility mode, which is divided into a pre-charge phase, an output phase, a reset phase and a denoising phase.

In the pre-charge phase, the second switch transistor M2 is turned on under the control of the reset signal input by the reset signal terminal RESET, wherein the reset signal input by the reset signal terminal RESET is the output signal output by the output terminal Output(N+1) of the next stage of shift register, and the output signal output by the output terminal Output(N+1) of the next stage of shift register is the high level signal. The clock signal CLK output by the clock signal terminal is a low level signal. Since the second switch transistor M2 is turned on, the second power supply charges the capacitor C1 through the second switch transistor M2, such that the voltage of the pull-up node PU is pulled up. At this time, the voltage output by the second power supply is the voltage VDD, and the voltage VDD output by the second power supply is at the high level. Operation processes of other structures in the pre-charge phase could refer to the first embodiment, and thus no repeated description is given herein.

In the output phase, the second switch transistor M2 is turned off under the control of the reset signal input by the reset signal terminal RESET, wherein the reset signal input by the reset signal terminal RESET is the output signal output by the output terminal Output(N+1) of the next stage of shift register, and the output signal output by the output terminal Output(N+1) of the next stage of shift register is the low level signal. Operation processes of other structures in the output phase could refer to the first embodiment, and thus no repeated description is given herein.

In the reset phase, the first switch transistor M1 is turned on under the control of the input signal input by the signal input terminal Input(N), wherein the input signal input by the signal input terminal Input(N) is the output signal output by the output terminal Output(N−1) of the previous stage of shift register, and the output signal output by the output terminal Output(N−1) of the previous stage of shift register is the high level signal. After the first switch transistor M1 is turned on, the voltage of the pull-up node PU is pulled down to the voltage VSS output by the first power supply under the control of the voltage output by the first power supply. At this time, since the voltage VSS output by the first power supply is at the low level, the voltage of the pull-up node PU is at the low level, such that the third transistor M3, the sixth switch transistor M6 and the seventh switch transistor M7 are turned off. Operation processes of other structures in the reset phase could refer to the first embodiment, and thus no repeated description is given herein.

Operation process in the reset phase could refer to the first embodiment, and thus no repeated description is given herein.

Before the display of the next frame picture comes, the shift register keeps repeating the denoising phase and constantly carries out the denoising process. When the display of the current frame picture is ended up and before the display of the next frame picture comes, that is, in the V-blanking phase, the fifth switch transistor M5 is turned on under the control of the voltage output by the switch power supply SW, to denoise the output terminal Output. At this time, the voltage output by the switch power supply SW is at the high level. However, since the voltage of the pull-up node PU is at the low level, the twelfth switch transistor M12 is turned off under the control of the voltage of the pull-up node PU, such that the eleventh switch transistor M11 and the thirteenth switch transistor M13 are also turned off. Herein, when it needs to perform the touch control function, the touch control process can also be realized in the V-blanking phase. Since the output terminal Output is constantly denoised in the V-blanking phase, the driving signal output by the output terminal can be prevented from interfering with the touch control signal. It can be known from the above content that the compatibility mode can be also used in the V-blanking mode which performs the touch control in the V-blanking phase. In addition, when the display device does not perform the touch control phase, the compatibility mode can further be used in the display mode which does not perform the touch control. To sum up, the compatibility mode can be compatible with the display mode and the V-blanking mode. Therefore, the compatibility mode can be compatible with a conventional gate driving mode and the V-blanking gate driving mode of the in-cell touch control.

The second mode of the shift register is the H-blanking mode, comprising the pre-charge phase, the touch control phase, the output phase, the reset phase and the denoising phase. In this mode, the operation processes of the pre-charge phase, the output phase, the reset phase and the denoising phase are the same as the first mode, and thus no repeated description is given herein. The touch control phase of the present embodiment differs from the touch control phase of the first embodiment in: since the first switch transistor M1 and tenth switch transistor M10 have leakage phenomenon, it needs to carry out supplementary charge on the pull-up node PU. Other descriptions are the same as those in the first embodiment, and thus no repeated description is given herein.

Before the display of the next frame picture comes, the shift register keeps repeating the denoising phase and carries out the denoising process constantly. When the display of the current frame picture ends up and before the display of the next frame picture comes, that is, in the H-blanking phase, the fifth switch transistor M5 is turned on under the control of the voltage output by the switch power supply SW, to denoise the output terminal Output. At this time, the voltage output by the switch power supply SW is at the high level. However, since the voltage of the pull-up node PU is at the low level, the twelfth switch transistor M12 is turned off under the control of the voltage of the pull-up node PU, such that the eleventh switch transistor M11 and the thirteenth switch transistor M13 are also turned off. The H-Blanking mode can be applied to the H-blanking gate driving mode of the in-cell touch control.

In the shift register provided in the embodiment, the denoising module denoises the output terminal in the touch control phase, which prevents the driving signal output by the output terminal from interfering with the touch control signal, so as to avoid the touch control function of the display device from being affected; the compensation module charges the pull-up node in the touch control phase, which guarantees that the voltage of the pull-up node would not be reduced, so that the problem of no driving signal being output or the driving signal output voltage being too low is avoided from occurring after the touch control ends up. In the present embodiment, three switch transistors, i.e., the eleventh switch transistor, the twelfth switch transistor and the thirteenth switch transistors, are disposed in the compensation module, and the switch power supply needs to charge the pull-up node through two switch transistors, i.e., the eleventh switch transistor and the thirteen switch transistor, so that the coupling capacitance between the switch power supply and the pull-up node is reduced efficiently, which avoids the problem of influencing the display of other rows due to pulling up the voltage of the pull-up node PUT of other rows, so that the display quality is raised.

Figure 7:
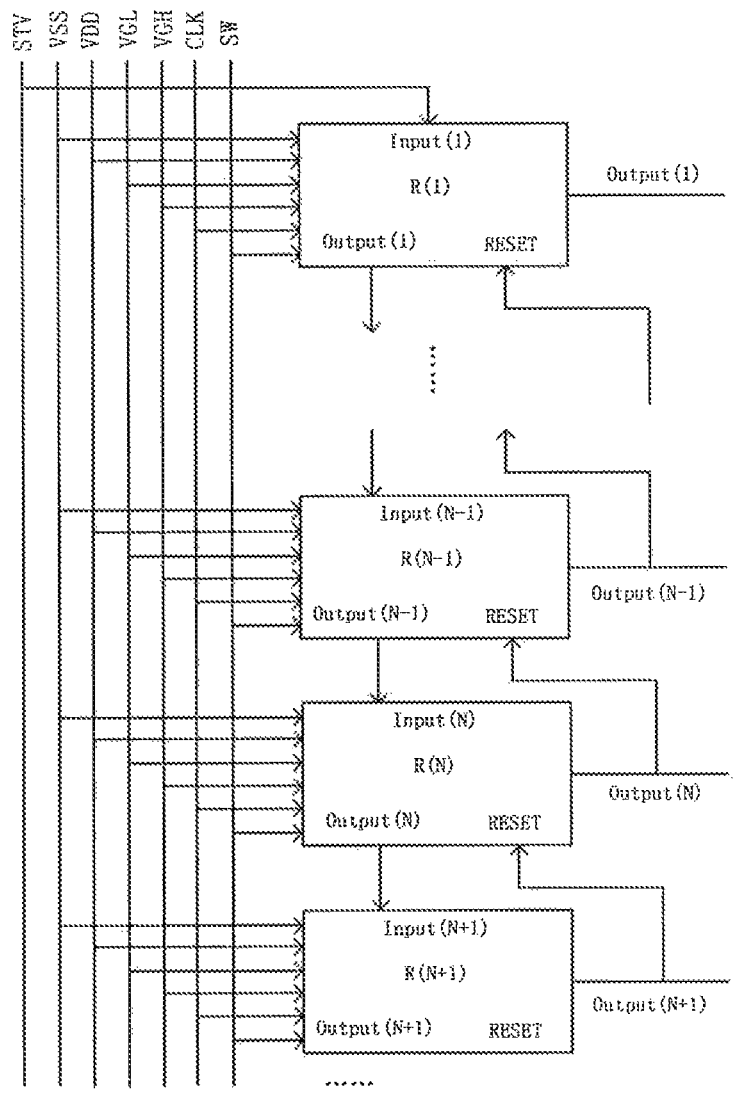
FIG. 7 is a structure schematic diagram of a gate driving circuit provided in a fourth embodiment of the present disclosure.

FIG. 7 is a structure schematic diagram of a gate driving circuit provided in a fourth embodiment of the present disclosure. As shown in FIG. 7, the gate driving circuit comprises: a plurality of shift registers connected in cascades.

An input terminal of a first stage of shift register R(1) receives a start signal STV. Except for the first stage of shift register R(1), an input terminal of each of remaining stages of shift registers is connected to an output terminal of a previous stage of shift register. For example, an input terminal Input(N) of a N-th stage of shift register R(N) is connected to an output terminal Output(N−1) of a (N−1)-th stage of shift register R(N−1). A reset terminal RESET of a last stage of shift register (not shown in the figure) receives a reset signal. Except for the last stage of shift register, a reset terminal of each of remaining stages of shift registers is connected to an output terminal of a next stage of shift register, for example, a reset terminal of a N-th stage of shift register R(N) is connected to an output terminal Output(N+1) of a (N+1)-th stage of shift register R(N+1).

The shift register in the present embodiment can adopt the shift register in the first embodiment, the second embodiment or the third embodiment.

In the gate driving circuit provided in the present embodiment, the denoising module denoises the output terminal, which prevents the driving signal output by the output terminal from interfering with the touch control signal, so as to avoid the touch control function of the display device from being affected; and the compensation module charges the pull-up node in the touch control phase, which guarantees that the voltage of the pull-up node would not reduce, so that the problem of no driving signal being output or the driving signal output voltage being too low is avoided from occurring after the touch control ends up.

There is provided in a fifth embodiment of the present disclosure a display device. The display device comprises: a gate driving circuit. The gate driving circuit can adopt the gate driving circuit provided in the fourth embodiment.

In the display device provided in the present embodiment, the denoising module denoises the output terminal in the touch control phase, which prevents the driving signal output by the output terminal from interfering with the touch control signal, thereby avoiding the touch control function of the display device from being affected; and the compensation module charges the pull-up node in the touch control phase, which guarantees that the voltage of the pull-up node would not reduce, so that the problem of no driving signal being output or the driving signal output voltage being too low is avoided from occurring after the touch control ends up.

There is provided in a sixth embodiment of the present disclosure a driving method of a shift register, comprising:

step 101, in the pre-charge phase: the pre-charge module charges the pull-up node;

step 102, in the output phase: the pull-up control module pulls up the potential of the pull-up node and outputs the driving signal through the output terminal;

step 103, in the reset phase: the reset module resets the pull-up node and the output terminal, and denoises the pull-up node and the output terminal in the denoising phase; and step 104, in the touch control phase: the denoising module denoises the output terminal.

Herein, the touch control phase is the V-blanking phase.

The driving method of the shift register provided in the present embodiment can be used for driving the shift register provided in the first embodiment, the second embodiment or the third embodiment.

In the driving method of the shift register provided in the present embodiment, the denoising module denoises the output terminal in the touch control phase, which prevents the driving signal output by the output terminal from interfering with the touch control signal, thereby avoiding the touch control function of the display device from being affected; and the compensation module charges the pull-up node in the touch control phase, which guarantees that the voltage of the pull-up node would not reduce, so that the problem of no driving signal being output or the driving signal output voltage being too low is avoided from occurring after the touch control ends up.

There is provided in a seventh embodiment of the present disclosure a driving method of a shift register, comprising:

step 201, in the pre-charge phase: the pre-charge module charges the pull-up node;

step 202, in the touch control phase: the denoising module denoises the output terminal.

Herein, the touch control phase is the H-blanking phase;

step 203, in the output phase: the pull-up control module pulls up the potential of the pull-up node and outputs the driving signal through the output terminal;

step 204, in the reset phase: the reset module resets the pull-up node and the output terminal, and denoises the pull-up node and the output terminal in the denoising phase;

The driving method of the shift register provided in the present embodiment can be used for driving the shift register provided in the first embodiment or the third embodiment.

In the driving method of the shift register provided in the present embodiment, the denoising module denoises the output terminal in the touch control phase, which prevents the driving signal output by the output terminal from interfering with the touch control signal, thereby avoiding the touch control function of the display device from being affected; and the compensation module charges the pull-up node in the touch control phase, which guarantees that the voltage of the pull-up node would not reduce, so that the problem of no driving signal being output or the driving signal output voltage being too low is avoided from occurring after the touch control ends up.

It could be understood that the above implementations are just exemplary implementations adopted to describe principles of the present disclosure. However, the present disclosure is not limited thereto. For those ordinary skilled in the art, various modifications and improvements can be made without departing from the spirit and substance of the present disclosure. These modifications and improvements also belong to the protection scope of the present disclosure.

What is claimed is:

1. A shift register, comprising:
   a pre-charge module, connected to a pull-up node, and configured to charge the pull-up node in a pre-charge phase;
   a pull-up control module, connected to the pull-up node and an output terminal, and configured to pull up a potential of the pull-up node in an output phase and output a driving signal through an output terminal;
   a denoising module, connected to the pull-up control module and the output terminal, and configured to denoise the output terminal in a touch control phase;
   a compensation module, connected to the pull-up node and configured to charge the pull-up node in the touch control phase; and
   a reset module, connected to the pre-charge module, the pull-up node, the denoising module and the output terminal, and configured to reset the pull-up node and the output terminal in a reset phase and denoise the pull-up node and the output terminal in a denoising phase,
   wherein the pull-up node is a connecting point between the pre-charge module, the reset module and the pull-up control module.

2. The shift register according to claim 1, further comprising: a pull-down control module connected to the pull-up node, a pull-down node and the reset module, and configured to pull down a potential of the pull-down node, and the pull-down node is a connecting point between the reset module and the pull-down control module.

3. The shift register according to claim 2, wherein the pull-down control module comprises: a sixth switch transistor; and
   a control electrode of the sixth transistor is connected to the pull-up node, a first electrode thereof is connected to the pull-down node, and a second electrode thereof is connected to the third power supply.

4. The shift register according to claim 1, wherein when forward scanning is carried out, the pre-charge module comprises a first switch transistor;
   a control electrode of the first switch transistor is connected to a signal input terminal;
   a first electrode of the first switch transistor is connected to a first power supply; and
   a second electrode of the first switch transistor is connected to the pull-up node.

5. The shift register according to claim 1, wherein when forward scanning is carried out, the reset module comprises: a second switch transistor, a fourth switch transistor, a seventh switch transistor, an eighth switch transistor, a ninth switch transistor and a tenth switch transistor;
   a control electrode of the second switch transistor is connected to a reset signal terminal, a first electrode of the second switch transistor is connected to the pull-up node, and a second electrode of the second switch transistor is connected to a second power supply;
   a control electrode of the fourth switch transistor is connected to the pull-down node, a first electrode of the fourth switch transistor is connected to the pull-up control module, the output terminal and the denoising module, and a second electrode of the fourth switch transistor is connected to a third power supply and the denoising module;
   a control electrode of the seventh switch transistor is connected to the pull-up node, a first electrode of the seventh switch transistor is connected to a control electrode of the eighth switch transistor and a second electrode of the ninth switch transistor, and a second electrode of the seventh switch transistor is connected to the third power supply;
   the control electrode of the eighth switch transistor is connected to the second electrode of the ninth switch transistor, a first electrode of the eighth switch transistor is connected to a fourth power supply and a control electrode of the ninth switch transistor, and a second electrode of the eighth switch transistor is connected to the pull-down node;
   the control electrode of the ninth switch transistor is connected to a first electrode of the ninth switch transistor and the fourth power supply; and
   a control electrode of the tenth switch transistor is connected to the pull-down node, a first electrode of the tenth switch transistor is connected to the pull-up node, and a second electrode of the tenth switch transistor is connected to the third power supply.

6. The shift register according to claim 1, wherein when backward scanning is carried out, the pre-charge module comprises a second switch transistor;
the control electrode of the second switch transistor is connected to the reset signal terminal;
the first electrode of the second switch transistor is connected to the pull-up node; and
the second electrode of the second switch transistor is connected to the second power supply.

7. The shift register according to claim 1, wherein when backward scanning is carried out, the reset module comprises: a first switch transistor, a fourth switch transistor, a seventh switch transistor, an eighth switch transistor, a ninth switch transistor and a tenth switch transistor;
a control electrode of the first switch transistor is connected to the signal input terminal, a first electrode of the first switch transistor is connected to the first power supply, and a second electrode of the first switch transistor is connected to the pull-up node;
the control electrode of the fourth switch transistor is connected to the pull-down node, the first electrode of the fourth switch transistor is connected to the pull-up control module, the output terminal and the denoising module, and the second electrode of the fourth switch transistor is connected to the third power supply and the denoising module;
the control electrode of the seventh switch transistor is connected to the pull-up node, the first electrode of the seventh switch transistor is connected to the control electrode of the eighth switch transistor and the second electrode of the ninth switch transistor, and the second electrode of the seventh switch transistor is connected to the third power supply;
the control electrode of the eighth switch transistor is connected to the second electrode of the ninth switch transistor, the first electrode of the eighth switch transistor is connected to the fourth power supply and the control electrode of the ninth switch transistor, and the second electrode of the eighth switch transistor is connected to the pull-down node;
the control electrode of the ninth switch transistor is connected to the first electrode of the ninth switch transistor and the fourth power supply; and
the control electrode of the tenth switch transistor is connected to the pull-up node, the first electrode of the tenth switch transistor is connected to the pull-up node, and the second electrode of the tenth switch transistor is connected to the third power supply.

8. The shift register according to claim 1, wherein the pull-up control module comprises: a third switch transistor and a capacitor;
a control electrode of the third switch transistor is connected to the pull-up node, a first electrode of the third switch transistor is connected o a clock signal terminal, ad a second electrode of the third switch transistor is connected to a second terminal of the capacitor, and the output terminal and the denoising module;
a first terminal of the capacitor is connected to the pull-up node, and the second terminal of the capacitor is connected to the output terminal, the reset module, and the denoising module.

9. The shift register according to claim 1, wherein the denoising module comprises: a fifth switch transistor; and a control electrode of the fifth switch transistor is connected to a switch power supply, a first electrode of the fifth switch transistor is connected to the reset module, the output terminal and the pull-up control module, and a second electrode of the fifth switch transistor is connected to the reset module and the third power supply.

10. The shift register according to claim 1, wherein the compensation module comprises: an eleventh switch transistor, a twelfth switch transistor and a thirteenth switch transistor;
a control electrode of the eleventh switch transistor is connected to a second electrode of the twelfth transistor and a control electrode of the thirteenth transistor, a first electrode of the eleventh switch transistor is connected to the switch power supply and a first electrode of the twelfth switch transistor, and a second electrode of the eleventh switch transistor is connected to a first electrode of the thirteen switch transistor;
a control electrode of the twelfth switch transistor is connected to the pull-up node, a first electrode of the twelfth switch transistor is connected to the switch power supply, and a second electrode of the twelfth switch transistor is connected to the control electrode of the thirteen switch transistor; and
a second electrode of the thirteenth switch transistor is connected to the pull-up node.

11. A gate driving circuit, comprising: multiple shift registers connected in cascades according to claim 1.

12. A display device, comprising the gate driving circuit according to claim 11.

13. The gate driving circuit according to claim 11, further comprising: a pull-down control module connected to the pull-up node, a pull-down node and the reset module, and configured to pull down a potential of the pull-down node, and the pull-down node is a connecting point between the reset module and the pull-down control module.

14. The gate driving circuit according to claim 11, wherein when forward scanning is carried out, the pre-charge module comprises a first switch transistor;
a control electrode of the first switch transistor is connected to a signal input terminal;
a first electrode of the first switch transistor is connected to a first power supply; and
a second electrode of the first switch transistor is connected to the pull-up node.

15. The gate driving circuit according to claim 11, wherein when forward scanning is carried out, the reset module comprises: a second switch transistor, a fourth switch transistor, a seventh switch transistor, an eighth switch transistor, a ninth switch transistor and a tenth switch transistor;
a control electrode of the second switch transistor is connected to a reset signal terminal, a first electrode of the second switch transistor is connected to the pull-up node, and a second electrode of the second switch transistor is connected to a second power supply;
a control electrode of the fourth switch transistor is connected to the pull-down node, a first electrode of the fourth switch transistor is connected to the pull-up control module, the output terminal and the denoising module, and a second electrode of the fourth switch transistor is connected to a third power supply and the denoising module;
a control electrode of the seventh switch transistor is connected to the pull-up node, a first electrode of the seventh switch transistor is connected to a control electrode of the eighth switch transistor and a second electrode of the ninth switch transistor, and a second electrode of the seventh switch transistor is connected to the third power supply;

the control electrode of the eighth switch transistor is connected to the second electrode of the ninth switch transistor, a first electrode of the eighth switch transistor is connected to a fourth power supply and a control electrode of the ninth switch transistor, and a second electrode of the eighth switch transistor is connected to the pull-down node;

the control electrode of the ninth switch transistor is connected to a first electrode of the ninth switch transistor and the fourth power supply; and a control electrode of the tenth switch transistor is connected to the pull-down node, a first electrode of the tenth switch transistor is connected to the pull-up node, and a second electrode of the tenth switch transistor is connected to the third power supply.

16. The shift register according to claim 11, wherein when backward scanning is carried out, the pre-charge module comprises a second switch transistor;

the control electrode of the second switch transistor is connected to the reset signal terminal;

the first electrode of the second switch transistor is connected to the pull-up node; and the second electrode of the second switch transistor is connected to the second power supply.

17. The shift register according to claim 11, wherein when backward scanning is carried out, the reset module comprises: a first switch transistor, a fourth switch transistor, a seventh switch transistor, an eighth switch transistor, a ninth switch transistor and a tenth switch transistor;

a control electrode of the first switch transistor is connected to the signal input terminal, a first electrode of the first switch transistor is connected to the first power supply, and a second electrode of the first switch transistor is connected to the pull-up node;

the control electrode of the fourth switch transistor is connected to the pull-down node, the first electrode of the fourth switch transistor is connected to the pull-up control module, the output terminal and the denoising module, and the second electrode of the fourth switch transistor is connected to the third power supply and the denoising module;

the control electrode of the seventh switch transistor is connected to the pull-up node, the first electrode of the seventh switch transistor is connected to the control electrode of the eighth switch transistor and the second electrode of the ninth switch transistor, and the second electrode of the seventh switch transistor is connected to the third power supply;

the control electrode of the eighth switch transistor is connected to the second electrode of the ninth switch transistor, the first electrode of the eighth switch transistor is connected to the fourth power supply and the control electrode of the ninth switch transistor, and the second electrode of the eighth switch transistor is connected to the pull-down node;

the control electrode of the ninth switch transistor is connected to the first electrode of the ninth switch transistor and the fourth power supply; and the control electrode of the tenth switch transistor is connected to the pull-up node, the first electrode of the tenth switch transistor is connected to the pull-up node, and the second electrode of the tenth switch transistor is connected to the third power supply.

18. A driving method of a shift register, comprising:

in a pre-charge phase: charging a pull-up node by a pre-charge module;

in a touch control phase: denoising an output terminal by a denoising model and charging the pull-up node by a compensation module;

in an output phase: pulling up a potential of the pull-up node and outputting a driving signal through the output terminal by a pull-up control module; and in a reset phase: resetting the pull-up node and the output terminal and denoising the pull-up node and the output terminal in the denoising module by a reset module.

* * * * *